United States Patent [19]
Yamaki et al.

[11] Patent Number: 5,218,710
[45] Date of Patent: Jun. 8, 1993

[54] AUDIO SIGNAL PROCESSING SYSTEM HAVING INDEPENDENT AND DISTINCT DATA BUSES FOR CONCURRENTLY TRANSFERRING AUDIO SIGNAL DATA TO PROVIDE ACOUSTIC CONTROL

[75] Inventors: Makio Yamaki; Hiroyuki Ishihara, both of Tokyo; Norimichi Katsumura; Toshiyuki Naoe, both of Koufu; Yukio Matsumoto; Kazuhiro Hayashi, both of Tokyo; Kazuo Watanabe, Koufu, all of Japan

[73] Assignee: Pioneer Electronic Corporation, Tokyo, Japan

[21] Appl. No.: 467,403

[22] Filed: Jan. 22, 1990

[30] Foreign Application Priority Data

| Jun. 19, 1989 | [JP] | Japan | 1-156199 |
| Jun. 19, 1989 | [JP] | Japan | 1-156200 |
| Jun. 19, 1989 | [JP] | Japan | 1-156201 |
| Jun. 21, 1989 | [JP] | Japan | 1-159271 |
| Jun. 21, 1989 | [JP] | Japan | 1-159272 |
| Jun. 26, 1989 | [JP] | Japan | 1-163326 |
| Jun. 26, 1989 | [JP] | Japan | 1-163327 |

[51] Int. Cl.$^5$ .................................. G06F 13/00
[52] U.S. Cl. .................. 395/800; 364/232.93; 364/240.2; 364/271.5; 364/DIG. 1; 381/31; 381/61
[58] Field of Search ............ 395/800, 425, 775; 381/36, 31, 61; 364/413

[56] References Cited

U.S. PATENT DOCUMENTS

| Re. 31,977 | 8/1985 | Ott | 395/425 |
| 4,511,966 | 4/1985 | Hamada | 395/425 |
| 4,586,131 | 4/1986 | Caudel et al. | 395/775 |
| 4,757,469 | 7/1988 | Odijik | 395/425 |
| 4,975,843 | 12/1990 | Brunnett et al. | 364/413.14 |
| 5,086,475 | 2/1992 | Kutaragi et al. | 381/36 |

FOREIGN PATENT DOCUMENTS 64-72615  3/1989  Japan .

Primary Examiner—Lawrence E. Anderson
Assistant Examiner—Alpesh M. Shah
Attorney, Agent, or Firm—Foley & Lardner

[57] ABSTRACT

An audio signal data processing system comprises input device for sequentially supplying an audio signal data, data memory control device for writing the audio signal data into a data memory and reading-out the data from the data memory, delay memory control device for sequentially reading-out the audio signal data from the data memory and storing the data into a location of a delay memory indicated by a writing address and for reading-out the audio signal data from a location of the delay memory indicated by a reading address and writing the data into the data memory, address designating devices for designating the writing and reading addresses, arithmetic device for multiplying a predetermined coefficient data to the audio signal data having been read-out by the delay memory control device and written into the data memory, and output device for providing the audio signal data in accordance with a result of operation by the arithmetic device. The data memory control device and the delay memory control device write and read the audio signal data into and from the data memory through data buses independent from each other.

4 Claims, 10 Drawing Sheets

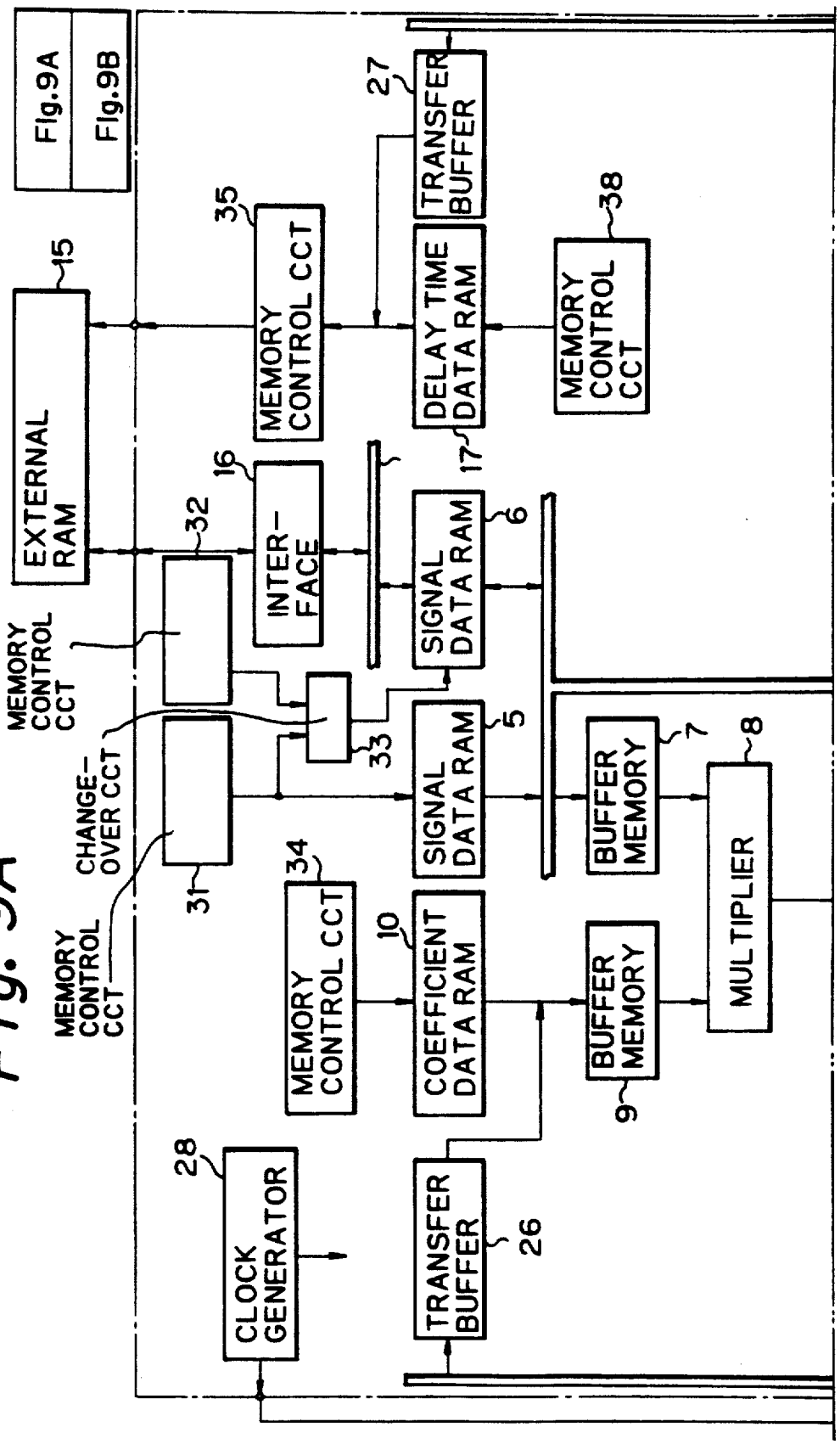

AUDIO SIGNAL PROCESSING SYSTEM HAVING INDEPENDENT AND DISTINCT DATA BUSES FOR CONCURRENTLY TRANSFERRING AUDIO SIGNAL DATA TO PROVIDE ACOUSTIC CONTROL

BACKGROUND OF THE INVENTION

1. Field of the Invention

The present invention relates to an audio signal data processing system for processing signal data such as an audio signal data.

2. Description of Background Information

There are known audio signal data processing systems capable of controlling the sound field by which a concert-hall (or theater) acoustics with reverberation sounds and the presence, for example, are created in a listening room or in an automobile. An example of the audio data processing system is disclosed in Japanese Patent Application Laid Open No. P64-72615. In such audio signal processing systems, a DSP (digital signal processor) is provided for controlling the sound field by digitally processing an audio signal output from an audio signal source such as a tuner. The DSP is configured so that operating processes such as operations of the four rules of arithmetic can be repeatedly executed at high speed.

In order to perform the control of sound field precisely, it is necessary to raise the speed of digital processing. However, it has been necessary to use high cost devices for attaining an increased speed of the digital processing. Therefore, reduction of the cost of the DSP has been required.

The DSP is equipped with an operating means for executing operations such as the operations of the four rules of arithmetic, and a data memory for storing the audio signal data to be supplied to the operating means. Furthermore, the DSP is configured so that an external memory for the delaying operation can be connected from the outside for generating a signal delay data by delaying the data stored in the data memory. In the DSP, the structure is such that the signal data is transferred between memories and also from a memory to the operating means in accordance with predetermined programs, in order that the operating process of the signal data can be repeatedly executed at high speed. Such programs are written in a rewritable memory such as the RAM in the DSP, and the program is changed by a microcomputer provided outside the DSP, every time the sound field mode is changed by a manual operation. In other words, variety of sound fields can be created alternately by changing the program.

In the audio signal data processing system described above, there has been the following drawback. When the program is changed, the signal data by the former program remains in the data memory and the delay memory immediately after the change of the program. Therefore, for a certain time interval after the start of the new program the operating process is performed using the signal data before the change of the program. This would lead to generation of improper audio signal data.

Furthermore, a muting function for temporarily stopping the output of the audio signal is generally provided in the audio signal data processing system described above. However, the system is generally structured such that the operating process of the system is stopped during the muting condition, and there has been a problem that a certain time period is required before a proper audio data is actually generated after canceling the muting state.

In the case of the audio signal data processing system described above, it is also desirable that, in addition to the control of sound field by using the DSP, the processing of other functions such as the function of a graphic equalizer can be performed easily.

Furthermore, an A/D converter is generally provided for converting the analog audio signal to a digital audio signal to be supplied to the DSP, in the audio signal data processing system described above. It is necessary that peripheral circuits be provided in addition to the A/D converter in order to attain the synchronization between the sampling timing of the A/D converter and the timing of operation of the DSP. This has been causing a problem in that the number of parts to be added to the DSP from outside becomes large.

The programs mentioned before are normally in the form of a parallel processing program consisting of two series of instructions. By the execution of the parallel processing program, two tasks such as the transfer of the signal data from the delay memory to the data memory and the execution of a certain instruction of arithmetic operation are performed simultaneously in the DSP.

In the case of the parallel processing program, there can be conditions in which the execution of an instruction in one series of processing instructions takes more time than the execution of an instruction in the other series of processing instructions. For example, when the program count value is increased by one, e.g. N, N+1, N+2, ..., as depicted in FIG. 7, an operating instruction is newly fetched each time the program count value is advanced by one in the first program as the one series of processing instructions mentioned above. In the second program as the other series of operating instructions mentioned above, on the other hand, an operating instruction is fetched each time the program count value is advanced by three, and an instruction NOP that does not specify an operation to be performed is fetched at timings of intervening program count values. In other words, one operating instruction OP in the second program requires an executing time corresponding to steps through which the program count value is advanced by three.

In this parallel processing program, the processing operation by the operating instruction OP of the first program is not subjected to the result of the processing operation by the operating instruction OP of the second program. Therefore, the operating instruction OP is newly fetched each time the program count value is advanced by one in the first program. However, there can be conditions in which the processing operation by the operating instruction OP in the first program is subjected to the result of the processing operation by the operating instruction in the second program. For instance, an operation of transferring the signal delay data from the delay memory to the data memory takes more time than the arithmetic operation. For executing an arithmetic operation after the signal delay data has been transferred to the data memory, the arithmetic operation is subjected to the result of the data transfer operation. In such a case, it is not possible to fetch the operating instruction of the next step when the execution of one operating instruction is completed, as the program count value is incremented. Accordingly, as depicted in FIG. 8, the instruction NOP is also inserted in the first program as in the second program, and the instruction NOP is fetched respectively in the first and second programs until the program count value is increased by two. In this way, the timing is adjusted so that the result of processing operation by the second program is used in the processing operation by the first program.

However, if the instruction NOP is inserted in program as mentioned above, the number of steps of a program increases, so that the program would not be received in the program memory in the DSP, or the efficiency of processing with respect to the capacity of the program memory would be decreased.

Furthermore, the DSP may be provided with a delay time memory for storing a delay time data indicating the time interval between the writing of the signal data into the delay memory and reading of the signal data therefrom. In the DSP, the data are transferred between memories or from memory to the operating means in accordance with predetermined programs, and the processing of the signal data is repeated at high speed as mentioned before. For example, a signal data having been entered is transferred to the delay memory to produce a delay signal data, and the delay signal data is transferred to the operating means via the data memory, and multiplied with a coefficient data. In this way, a reflective sound data is produced in consideration of the level attenuation, to create an acoustic field.

The coefficient data and the delay time data are rewritten by the transfer of new data from the microcomputer outside the DSP each time the sound field mode is switched by a manual operation, so that variety of acoustic fields are created.

However, in such audio signal data processing systems, the number of unit bits of data which can be transferred by the microcomputer is smaller than the number of unit bits of the data controlled by the DSP. As a result, the speed of transferring the coefficient data or the delay time data from the microcomputer to the memory becomes low. Therefore, during the rewriting of data, adequate output of the DSP is not generated for a relatively long interval. Due to this reason, a muting operation for interrupting the output of the DSP, or stopping the processing operation of the DSP has been necessitated. These operations, however, have caused a problem of interrupting the audio output.

OBJECT AND SUMMARY OF THE INVENTION

An objective of the present invention is to provide an audio signal data processing system which is able to perform the control of sound field with a sufficient accuracy even using relatively low-speed devices.

Another objective of the present invention is to provide an audio data processing system by which a proper audio signal data based on a new program is immediately generated upon the change of program.

A further objective of the present invention is to provide an audio data processing system by which a proper audio signal data is immediately generated after canceling the muting condition.

A still further objective of the present invention is to provide an audio signal data processing system by which the processing of functions other than the control of sound field can be easily performed.

A further objective of the present invention is to provide an audio signal data processing system in which the A/D converter can be connected to the DSP without using any parts connected to the DSP from outside.

A still further objective of the present invention is to provide a data processing system in which the efficiency of processing can be increased without the necessity of increasing the capacity of the program memory.

A still another objective of the present invention is to provide an audio data processing system in which the rewriting of the coefficient data and the delay time data can be performed without interrupting the output of audio signal.

According to the present invention, the audio signal data processing system comprises input means for sequentially supplying an audio signal data, data memory control means for writing the audio signal data into a data memory and reading-out the data from the data memory, delay memory control means for sequentially reading-out the audio signal data from the data memory and storing the data into a location of a delay memory indicated by a writing address and for reading-out the audio signal data from a location of the delay memory indicated by a reading address and writing the data into the data memory, address designating means for designating the writing and reading addresses, arithmetic means for multiplying a predetermined coefficient data to the audio signal data having been read-out by the delay memory control means and written into the data memory, and output means for providing the audio signal data in accordance with a result of operation by the arithmetic means, wherein the data memory control means and delay memory control means write and read the audio signal data into and from the data memory through data buses independent from each other.

According to another aspect of the present invention, the audio signal data processing system comprises input means for sequentially supplying an audio signal data, data memory control means for writing the audio signal data into a data memory and reading-out the data from the data memory, delay memory control means for sequentially reading-out the audio signal data from the data memory and storing the data into a location of a delay memory indicated by a writing address and for reading-out the audio signal data from a location of the delay memory indicated by a reading address and writing the data into the data memory, address designating means for designating the writing and reading addresses, arithmetic means for multiplying a predetermined coefficient data to the audio signal data having been read-out by the delay memory control means and written into the data memory, output means for providing the audio signal data in accordance with a result of operation by the arithmetic means, and sequence control means for controlling operations of means described above in accordance with a designated program, wherein the sequence control means initialize the data memory and the delay memory when another program is designated.

According to a still further aspect of the present invention, the audio signal data processing system comprises input means for sequentially supplying an audio signal data, data memory control means for writing the audio signal data into a data memory and reading-out the data from the data memory, delay memory control means for sequentially reading-out the audio signal data from the data memory and storing the data into a location of a delay memory indicated by a writing address and for reading-out the audio signal data from a location of the delay memory indicated by a reading address and writing the data into the data memory, address designating means for designating the writing and reading addresses, arithmetic means for multiplying a predetermined coefficient data to the audio signal data having been read-out by the delay memory control means and written into the data memory, and output means for providing the audio signal data in accordance with a result of operation by the arithmetic means, wherein the output means includes inhibiting means for inhibiting the audio signal data based on the result of arithmetic operation in response to a muting command.

According to a further aspect of the present invention, the audio signal data processing system comprises input means for sequentially supplying an audio signal data, data memory control means for writing the audio signal data into a data memory and reading-out the data from the data memory, delay memory control means for sequentially reading-out the audio signal data from the data memory and storing the data into a location of a delay memory indicated by a writing address and for reading-out the audio signal data from a location of the delay memory indicated by a reading address and writing the data into the data memory, address designating means for designating the writing and reading addresses, arithmetic means for multiplying a predetermined coefficient data to the audio signal data having been read-out by the delay memory control means and written into the data memory, and output means for providing the audio signal data in accordance with a result of operation by the arithmetic means, wherein the data memory comprises at least two memory devices of which writing and reading operations of each memory device can be performed independently from writing and reading operations of another memory device.

According to a still further aspect of the present invention, the audio signal data processing system comprises an A/D converter for converting an input analog audio signal to an audio signal data, processing means for executing an operating process to the audio signal data and providing a result of operating process as the audio signal data, and a clock pulse generating means provided in the processing means, for generating clock pulses for controlling timings of the operation of the processing means, wherein the D/A converter is provided with the clock pulses, and performs a converting operation in synchronism with the clock pulses.

According to a still further aspect of the present invention, the data processing system comprises a memory in which a parallel processing program consisting of a plurality of series of processing instructions is stored, a control means for reading the processing instructions of the parallel processing program from the memory by one step and for generating instruction signals respectively corresponding to the processing instructions read out, and a processing means for executing data processing operations corresponding to each of the instruction signals, wherein the control means further includes means for adjusting the time interval between fetching of each processing instruction at one step and fetching of each processing instruction at the next step, in response to an externally supplied command.

According a still another aspect of the present invention, the audio signal data processing system comprises input means for sequentially supplying an audio signal data, data memory control means for writing the audio signal data into a data memory and reading-out the data from data memory, delay memory control means for sequentially reading-out the audio signal data from the data memory and storing the data into a location of a delay memory indicated by a writing address and for reading-out the audio signal data from a location of the delay memory indicated by a reading address and writing the data into data memory, delay time memory control means for writing a delay time data into a delay time memory and reading the delay time data to designate the reading address, coefficient memory control means for writing a coefficient data into a coefficient memory and for reading the coefficient data, arithmetic means for multiplying the coefficient data read by the coefficient memory control means to the audio signal data having been read-out by the delay memory control means and written into the data memory, wherein the coefficient memory control means has a first transfer buffer for holding the coefficient data and rewrites the data in the coefficient memory by transferring the coefficient data held in the first transfer buffer, and the delay time memory control means has a second transfer buffer for holding the delay time data and rewrites the data in the delay time memory by transferring the delay time data held in the second transfer buffer.

DETAILED DESCRIPTION OF PREFERRED EMBODIMENTS

Figure 1A:
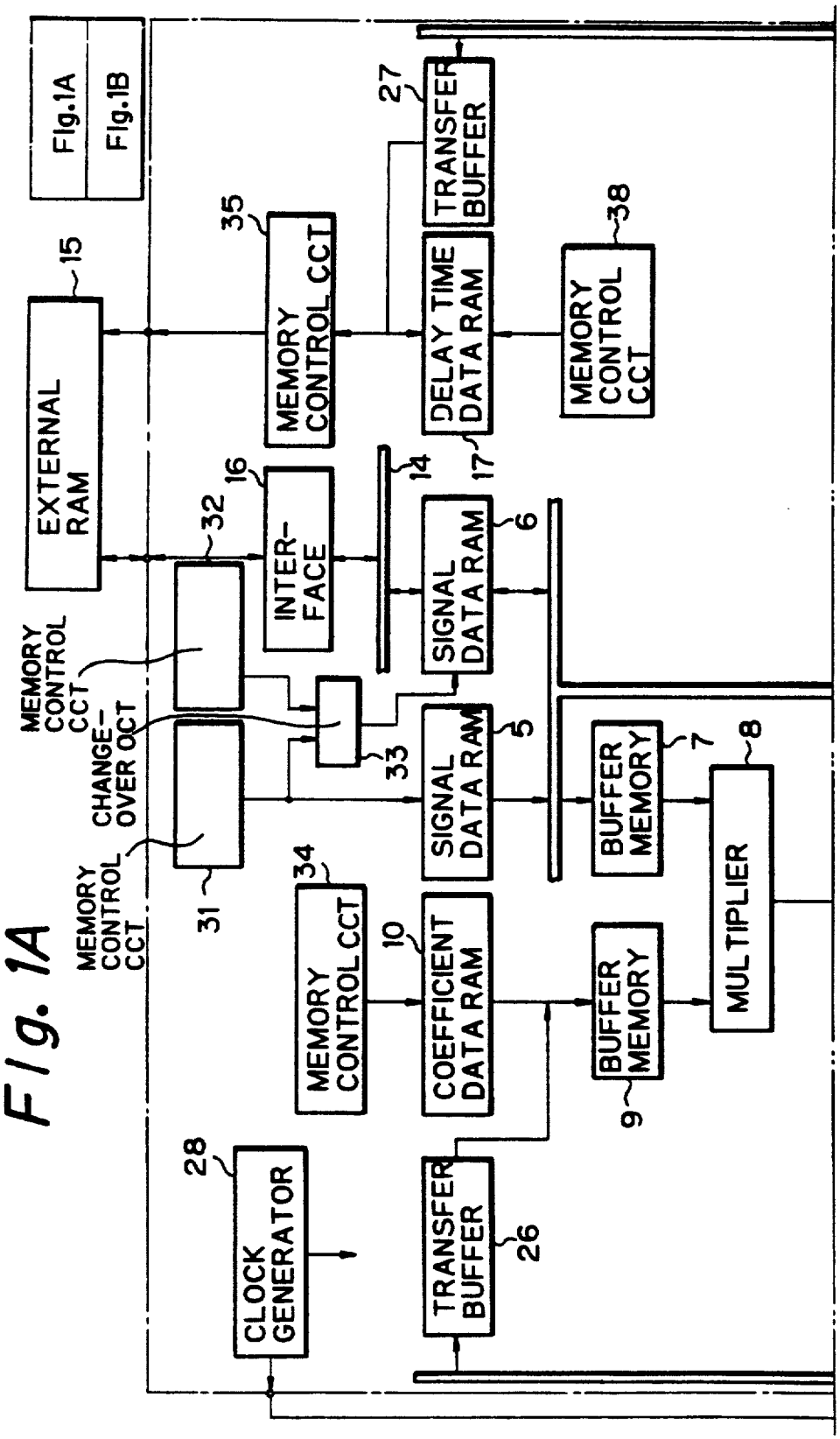
FIG. 1 is a block diagram showing an embodiment of the present invention.
Figure 1B:
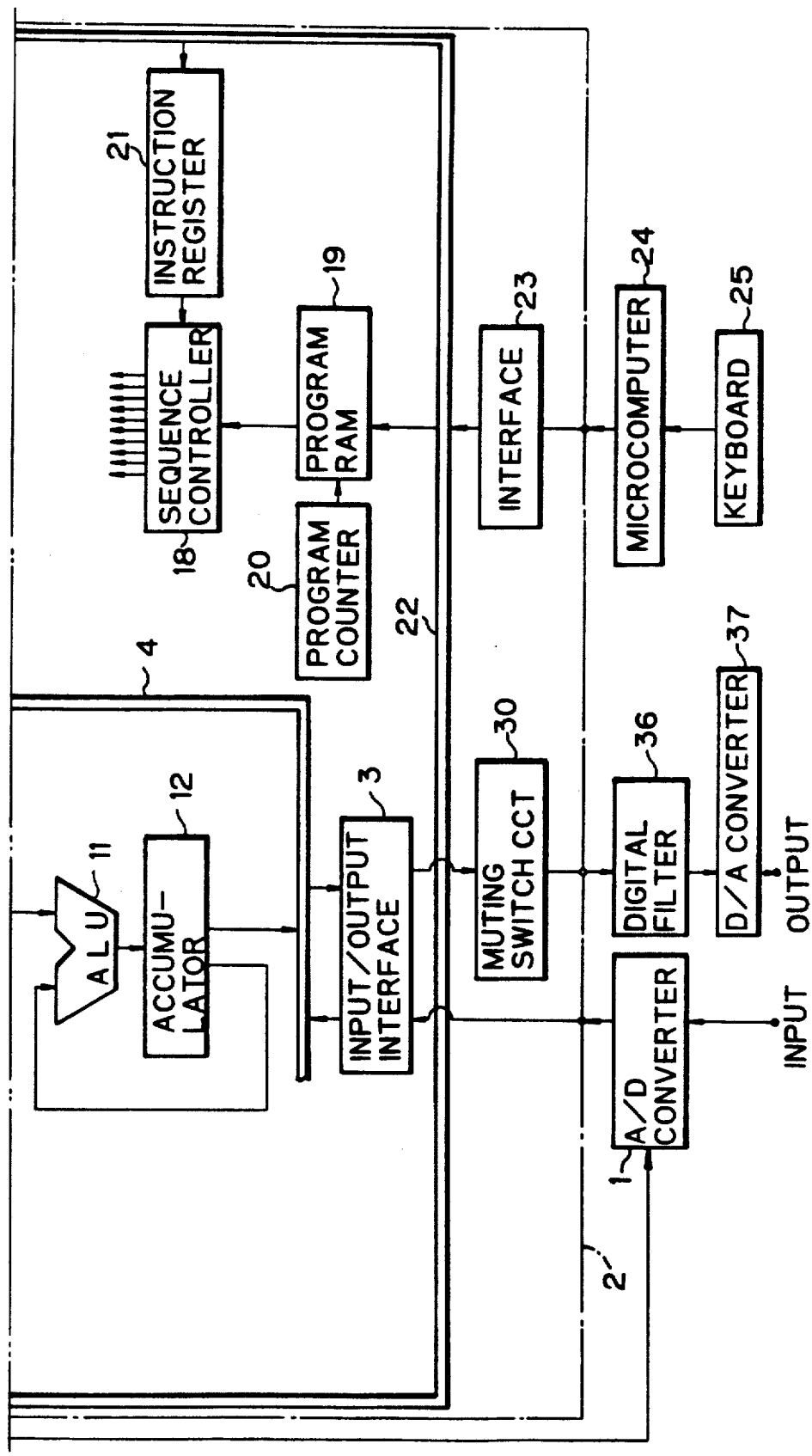

The embodiments of the present invention will be explained with reference to the accompanying drawings In the audio signal data processing system shown in FIG. 1 as an embodiment of the present invention, analog audio signals are supplied to an input/output interface 3 in a DSP (digital signal processor) 2 trough an A/D converter 1. A first data bus 4 is connected to the input/output interface 3. As data memory for storing the audio signal data, two signal data RAMs 5 and 6 are connected to the first data bus 4. A buffer memory 7 is further connected to the data bus 4, and the output-data of the buffer memory 7 is connected to one of two inputs of a multiplier 8. A buffer memory 9 for holding the coefficient data is connected to the other input of the multiplier 8. A coefficient data RAM 10 for storing a plurality of coefficient data is further connected to the buffer memory 9. An ALU (arithmetic logic unit) 11 is provided for executing operations such as the accumulation of the calculation output of the multiplier 8 which is supplied to one of two inputs of the ALU 11. An accumulator 12 is provided for holding the calculation output of the ALU 11, and its output is connected to the other input of the ALU 11. The output of the accumulator 12 is connected to the data bus 4.

A memory control circuit 31 is connected to the signal data RAM 5. The memory control circuit 31 generates a control signal for controlling the writing of data into designated address of the RAM 5 and reading of data from designated address of the RAM 5. A memory control circuit 32 like the memory control circuit 31 is connected to the signal data RAM 6 via a change-over circuit 33. The change-over circuit 33 is configured to switch its operation between an operation for writing data into the designated address of the RAM 6 and an operation for reading data from the designated address in response to the control signal from the memory control circuit 31. A memory control circuit 34 like the memory control circuit 31 is connected to the coefficient data RAM 10.

Figure 2:
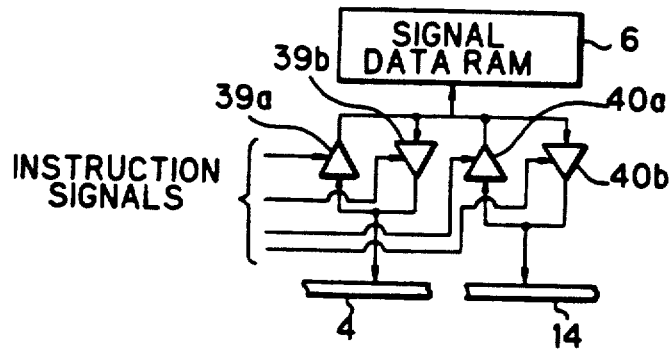
FIG. 2 is a circuit diagram particularly showing a part of the system shown in FIG. 1.

The signal data RAM 6 is also connected to a second data bus 14 which is independent from the first data bus 4. Specifically, there are provided a couple of tri-state buffers 39a and 39b between the signal data RAM 6 and the first data bus 4 and a couple of tri-state buffers 40a and 40b between the signal data RAM 6 and the second data bus 14, as illustrated in FIG. 2. The buffers 39a, 39b, 40a and 40b are respectively on-off controlled in response to instruction signals from a sequence controller which will be described later. For writing the signal data from the first data bus 4 into the RAM 6, the buffer 39a turns on, and the buffer 39b turns on when the signal data is read-out from the RAM 6 to the first data bus 4. Similarly, for writing the signal data from the data bus 14 into the RAM 6, the buffer 40a turns on, and the buffer 40b turns on when the signal data is read-out from the RAM 6 to the second data bus 14. Thus, one of the tri-state buffers 39a, 39b, 40a, and 40b, which turn on in response to instruction signals, is always turned on.

An interface 16 for the data transfer to and from an external RAM 15 is connected to the data bus 14. The external RAM 15, which is a memory for the delay operation, is provided for producing a delay signal data of the audio signal data, and is capable of producing a signal data whose delay time is lengthened as the memory capacity increases. A memory control circuit 35 is provided for designating writing and reading addresses o the RAM 15, and a delay time data RAM 17 is connected to the memory control circuit 35. The operations of writing and reading-out the delay time data in the RAM 17 are controlled by a memory control circuit 38.

Operations of the interfaces 3 and 16, multiplier 8, buffer memories 7 and 9, ALU 11, accumulator 12, memory control circuits 31, 32, 34, 35 and 38, and change-over circuit 33 are controlled by the sequence controller 18. A program RAM 19 is connected to the sequence controller 18, and the sequence controller operates in accordance with the program written in the program RAM 19. A program counter 20 is connected to the program RAM 19, and every time the count value of the program counter 20 is incremented, an instruction code of the step corresponding to the new count value is read-out from the program RAM 19 and supplied to the sequence controller 18. To the sequence controller 18, also a register 21 for holding a plurality of commands from a microcomputer 24 described later is connected.

The program RAM 19 and the register 21 are respectively connected to a main bus 22. The microcomputer 24 is connected to the main bus via an interface 23. To the main bus 22, transfer buffers 26 and 27 are connected. The transfer buffer 26 temporarily holds the coefficient data supplied from the microcomputer 24 for storing it in the ram 10. The transfer buffer 27 temporarily holds the delay time data supplied from the microcomputer 14 for storing it in the RAM 17.

The microcomputer 24 is constituted by a microprocessor, RAM, ROM, and an interface (not shown). A keyboard is connected to the microcomputer 24. The keyboard 25 is provided with a plurality of keys such as a plurality of mode keys for respectively designating a sound field mode, e.g. "hall 1", "hall 2" having different sound field characteristics, a frequency band setting key for controlling a graphic equalizer function, a level adjusting key, and a muting key (not shown). In the ROM of the microcomputer 24, various programs and data are previously written. Those programs and data are, namely, a plurality of sequence control programs to be processed by the sequence controller 18, in addition to a DSP control program which is processed by the microcomputer 24 itself, a plurality of coefficient data groups to be supplied to the RAM 10, and a plurality of delay time data group to be supplied to the RAM 17 for setting the reading address.

In the DSP 2, a clock generator 28 is provided, and clock pulses are supplied from the clock generator 28 to the sequence controller 18 and the program counter 20. The clock pulses generated by the clock generator 28 are also used as the timing signal of the A/D converter 1.

The audio signal data issued from the interface 3 is supplied to a muting switch circuit 30. When the muting switch circuit 30 is turned on, the audio signal data is supplied to the D/A converter 37 via a digital filter 36. The on-off control of the muting switch circuit 30 is performed by instruction signals output from the sequence controller 18.

In the arrangement described above, the sequence controller 18 generates various instruction signals in addition to the instruction signals for the on-off control of the above-described tri-state buffers 39a through 40b and the muting switch circuit 30. Those instruction signals are, namely, instruction signal for transferring the coefficient data group held in the transfer buffer 26 to the RAM 10, instruction signal for transferring the address data group held in the transfer buffer 27 to the RAM 17, transfer instruction signal for transferring the audio signal data from the interface 3 to the designated address of the signal data RAMs 5 and 6, instruction signal for reading-out the signal data from the designated address of the signal data RAM 5 and 6 and transferring it to the buffer memory 7, instruction signal for reading-out the coefficient data from the designated address of the RAM 10 and transferring it to the buffer memory 9, instruction signal for instructing various operations of the ALU 11, transfer instruction signal for transferring the signal data held in the accumulator 12 to the designated address of the RAMs 5 and 6 or to the buffer 7, transfer instruction signal for transferring data from the designated address of the signal data RAM 6 to the designated writing address of the external RAM 15, transfer instruction signal for transferring data from the designated delay address of the external RAM 15 to the designated address of the signal data RAM 6, and reset instruction signal for initializing the RAMs 5 and 6 and the external RAM 15. These instruction signals are generated at appropriate timings according to commands from the microcomputer 24 or the program stored in the RAM 19. Since the commands from the microcomputer 24 is held in the command register 21, the sequence controller 18 generates an instruction signal corresponding to the command from the microcomputer 24 by monitoring the contents of the command register 21 during its operation according to the program. The command held in the command register 21 is canceled by the sequence controller 18 for example, when the corresponding instruction signal is generated.

When any one of the mode keys of the keyboard 25 is operated, the microcomputer 24 judges whether or not the operated key is a key for designating a sound filed mode different from the sound field mode presently selected (step S41). When a sound field mode different from the present sound field mode is designated, the processor supplies the muting control instruction to the sequence controller 18 in order to turn off the muting switch circuit 30 immediately for placing the system in a muting state (step S42). Then the microcomputer reads a sequence control program corresponding to the operated key, a coefficient data group $a_1, a_2, \ldots a_n$, and a delay time data group $t_1, t_2, \ldots t_n$ from the ROM, and transfers them to the DSP 2 (steps S43 through S45). The sequence control program is transferred to the RAM 19 through the interface 23 and the main bus 22, and written in the RAM 19 by a memory writing control circuit (not shown). The coefficient data group is transferred to the transfer buffer 26 through the interface 23 and the main bus 22. The delay time data group is transferred to the transfer buffer 27 through the interface 23 and the main bus 22. After transferring the coefficient data and the delay time data to the transfer buffers 26 and 27 respectively, the microcomputer 24 issues a data change-over command to the sequence controller 18 (step S46). Furthermore, the microcomputer 24 issues an initialization command to the sequence controller 18 (step S47). In response to the data change-over command, the sequence controller 18 issues a predetermined instruction signal to the memory control circuits 34 and 38, to write the coefficient data group transferred to the transfer buffer 26 into a predetermined area of the RAM 10 and to write the delay time data group transferred to the transfer buffer 27 into a predetermined area of the RAM 17. Furthermore, since the sequence controller 18 issues the above-mentioned reset instruction signal to the memory control circuits 31, 32, and 35 in response to the initialization command, "0" is written into the whole memory areas of the RAMs 5 and 6, and the external RAM 15 by means of the memory control circuits 31, 32, and 35.

After the execution of the step S47, the microcomputer 24 issues a muting cancel command to the sequence controller 18, to turn-on the muting switch circuit 30 thereby canceling the muting state (step S48). More specifically, the muting switch circuit 30 is turned off only during the period required for changing data or program in the RAM 10, 17 and 19 in order to switch from the present sound field mode to another sound field mode. This function is provided for preventing the generation of noise signals by the change of data or program.

In addition, the system may be arranged such that, instead of generating the initialization command, the microcomputer 24 generates the reset instruction signal immediately after that the sequence controller 18 generated instruction signals for transferring data to the RAM 10 and 17 in response to the data change-over command.

Then, the signal data processing operation within the DSP 2 will be explained. The audio signal supplied to the A/D converter 1 is converted to an audio signal data group $d_1, d_2, \ldots d_n$ at each of sampling timings synchronized with clock pulses from the clock generator 28. The audio signal data group is supplied to the first data bus 4 via the interface 3. The signal data group supplied to the data bus is in turn supplied to the RAM 5 or 6, and stored therein.

The signal data written in the RAM 6 is sequentially transferred to an output register (not shown) in the interface 16 via the second data bus 14, and from the output register, further written into memory locations of the external RAM 15 designated by the writing address. The writing address is controlled by the memory control circuit 35, and one of a plurality of addresses whose number corresponds to the number of memory locations of the external RAM 15 is sequentially selected in a predetermined order each time the transferred signal data is supplied. In the external RAM 15, the signal data in the memory location designated by the reading address is read-out, and transferred to an input register (not shown) in the interface 16. Since the delay time data stored in the RAM 17 is read-out by the memory control circuit 38 and supplied to the memory control circuit 35, the reading address is set according to the delay time data supplied to the memory control circuit 35, using the writing address as a reference. In other words, the interval between the timing of writing a signal data into the RAM 15 and the timing of reading the same signal data becomes a delay time designated by the delay time data. The signal data transferred to the input register in the interface 16 and held therein is in turn transferred to the signal data RAM 16 via the data bus 14. A delay audio signal data for controlling the sound field is produced by the transfer operation with the external RAM 15 described above.

The coefficient data read-out from the RAM 10 is supplied to the buffer memory and held therein. At timings appropriately determined by the sequence controller 18, the signal data is transferred to the buffer memory 7 from the RAM 5 or 6, or the accumulator 12. Therefore, the multiplier 8 executes the multiplication between the signal data held in the buffer memory 7 and the coefficient data held in the buffer memory 9. In the case of computing a sum of products between a signal data group $d_1, d_2, \ldots d_n$ and the coefficient data group $a_1, a_2, \ldots a_n$ for example, the following operations will be performed. At first, $d_1$ is held in the buffer memory 7 for transmission, $a_1$ is held in the buffer memory 9 for transmission, $a_1 \cdot d_1$ is calculated in the multiplier 8, and "0" is added to $a_1 \cdot d_1$ at the ALU 11. The result of this operation is held in the accumulator 12. Subsequently, $d_2$ is held in the buffer memory 7 for transmission, and $a_2$ is held in the buffer memory 9 for transmission. At this time $a_2 \cdot d_2$ is calculated in the multiplier 8, $a_1 \cdot d_1$ is issued from the accumulator 12, and $a_1 \cdot d_1 + a_2 \cdot d_2$ is calculated in the ALU 11. By repeating these operations, $$\sum_{i=1}^{n} ai \cdot di$$

is calculated.

$$\sum_{i=1}^{n} ai \cdot di$$

is issued from the interface 3.

Figure 4:
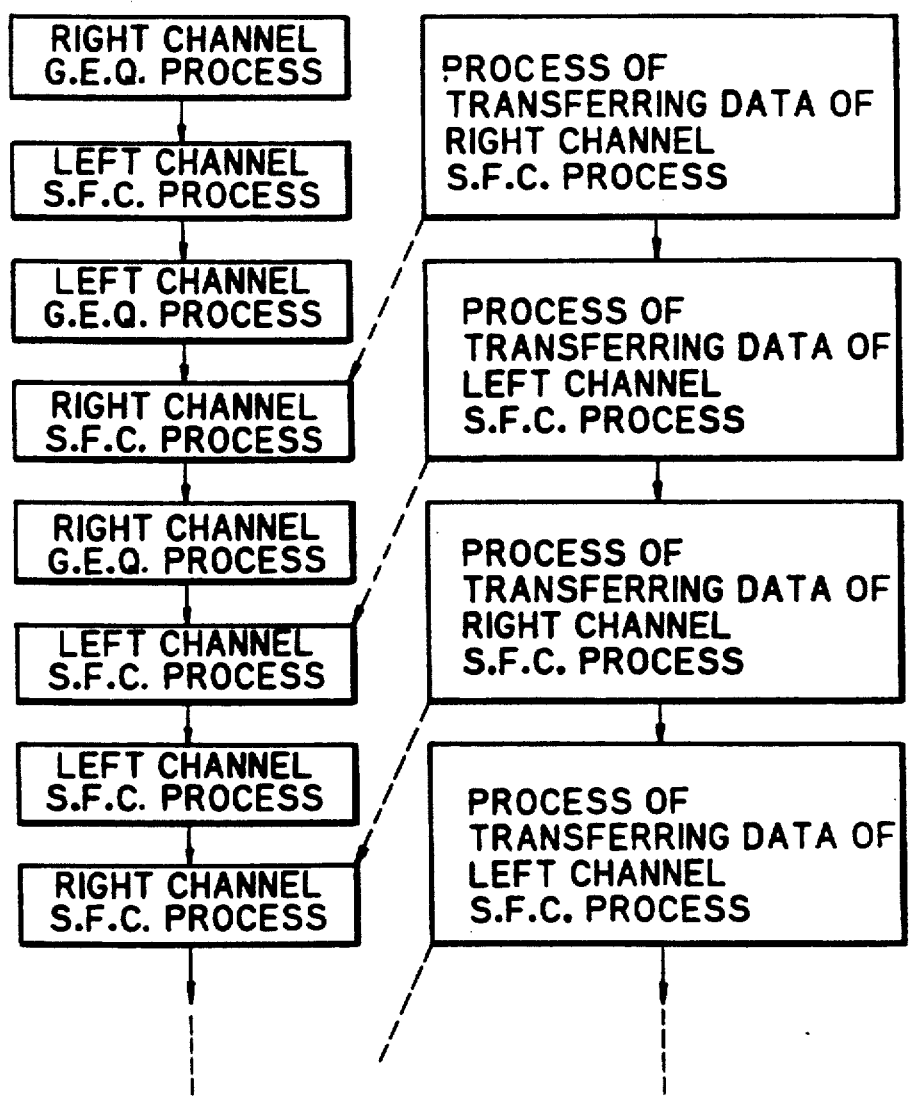
FIG. 4 is a diagram showing the order of the processing operations.

As shown in FIG. 4, the signal processing operation is repeated in the following order of, a graphic equalizing (G.E.Q.) process (process of a graphic equalizer) for the right channel, the sound field control process for the left channel, the graphic equalizing process for the left channel, and the sound field control process for the right channel These four process operations are performed by using the first data bus 4. On the other hand, the above-described process of producing the delay audio signal data is performed in parallel with these graphic equalizing process and the sound field control process Specifically, as shown in FIG. 4, during the graphic equalizing process of the right channel and the sound field control process of the left channel the delay audio signal data for the sound field control process of the right channel is transferred from the external RAM 15 to the signal data RAM 16 by means of the second data bus 14. Also, during the graphic equalizing process of the left channel and the sound field control process of the right channel, the delay audio signal data for the sound field control process of the left channel is transferred from the external RAM 15 to the signal data RAM 16 by means of the second data bus 14.

In the case of the graphic equalizing process, coefficient data corresponding to the signal levels in the frequency bands of the left and right channels, which have been set by key operations for the graphic equalizer, are stored in the RAM 10. At the time of the calculation for each frequency band, the coefficient data is sequentially read-out from the RAM 10 and transferred to the buffer memory 9. The reading address of the RAM 5 is designated by the memory control circuit 31 at each step of execution, and the signal data is read-out from the designated address and transferred to the buffer memory 7 via the data bus 4.

The operation for one frequency band of graphic equalizer, for example, is as follows. At first, the signal data $d_{12}$ is read-out from the address $12_H$ of the RAM 5 in the first step. The read-out signal data $d_{12}$ and a coefficient data $a_0$ which has been set as described above are transferred to the buffer memories 7 and 9, and are multiplied with each other at the multiplier 8. To the result of the multiplication $a_0 \cdot d_{12}$, "0" is added by the ALU 11 in the third step which is two steps after the first step, and the result of the addition is in turn held in the accumulator 12.

In the second step, the signal data $d_{11}$ is read-out from the address $11_H$ of the RAM 5. The read-out signal data $d_{11}$ and the coefficient data $a_0$ having been set are multiplied with each other at the multiplier 8. To the result of the multiplication $a_0 \cdot d_{11}$, the value held in the accumulator 12 (the result of addition in the third step) is added by the ALU 11 in the fourth step, and the result of the addition is in turn held in the accumulator 12. Then, in the third step, the value held in the accumulator 12 three steps before (the last computation value of the one frequency band) $EQ_{n-1}$ is transferred to the address $10_H$ of the RAM 5 and to the buffer memory 7, and multiplied with the coefficient data $a_0$ at the multiplier 8. To the result of the multiplication $a_0 \cdot EQ_{n-1}$, a value held in the accumulator 12 (the result of the addition in the fourth step) is added by the ALU 11 in the fifth step, and the result of the addition is in turn held in the accumulator 12.

In the fourth step, the signal data $d_{14}$ is read-out from the address $14_H$ of the RAM 5. The read-out signal data $d_{14}$ and the coefficient data $a_0$ having been set are multiplied with each other at the multiplier 8. To the result of the multiplication $a_0 \cdot d_{14}$, the value held in the accumulator 12 (the result of addition in the fifth step) is added by the ALU 11 in the sixth step, and the result of the addition is in turn held in the accumulator 12. Then, in the fifth step, the signal data $d_{13}$ is read-out from the address $13_H$ of the RAM 5. The read-out signal data $d_{13}$ and the coefficient data $a_0$ having been set are multiplied with each other at the multiplier 8. To the result of the multiplication $a_0 \cdot d_{13}$, the value held in the accumulator 12 (the result of addition in the sixth step) is added by the ALU 11 in the seventh step, and the result of the addition is in turn held in the accumulator 12. In this way, the audio signal data for one frequency band component of the graphic equalizer is obtained. The similar operations are performed for all the frequency bands having been set. Although not shown, a shifter is provided in the output stage of the multiplier 8, and the result of multiplication by the multiplier 8 is supplied to the ALU 11 at appropriate timings.

Figure 5:
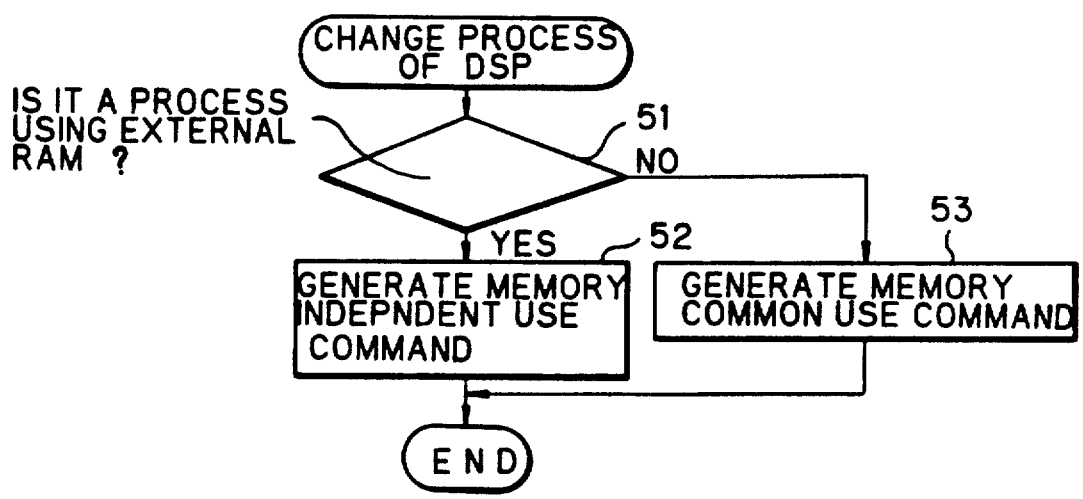

Then, the switching operation of the change-over circuit 33 will be explained. When the processing operation of the DSP 2 is changed by a key operation, the microcomputer 24 judges, as shown in FIG. 5, whether or not the process uses the external RAM 15 (step S51). In the case of performing the above-described processing of sound field for example, the process uses the external RAM 15. On the other hand, processes only including the graphic equalizing process and the filter process do not use the external RAM 15. In the case of the process using the external RAM 15, a memory-independent-use command is issued to the sequence controller 18 (step S52), and a memory-common-use command is issued to the sequence controller 18 (step S53) in the case of the process not using the external RAM 15. These commands are held in the register 21. In response to the contents of the command relating to the memory held in the register 21, the sequence controller 18 generates the instruction signal for switching the change-over circuit 33. More specifically, in the case of the memory-independent-use command, a control signal is supplied from the memory control circuit 32 to the RAM 6, and the writing and reading of the RAM 6 are controlled by the memory control circuit 32 in the state where the sound field control process is performed, or the sound field control process and the graphic equalizing process are performed in parallel with each other. In the case of the memory-common-use command, the control signal is supplied to the RAMs 5 and 6 from the memory control circuit 31, and the writing and reading of the signal data RAMs 5 and 6 are controlled by the memory control circuit 31 in the state where the process only includes the graphic equalizing process or the filter process which do not use the external RAM 15. Therefore, the memory control circuit 31 designates the address of the RAM 6 further to the designation of the writing and reading address of the RAM 5. For example, if the writing address exceeds the largest address of the RAM 5, the operation will shift to a writing operation in which the address of the RAM 6 is designated.

Figure 6:
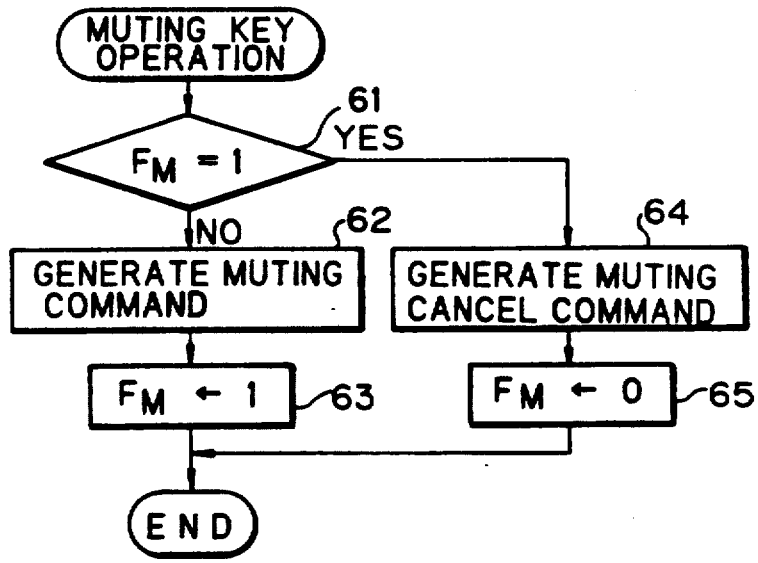

Operations in the case where the muting control key of the keyboard 25 is pressed will be explained. When the muting control key is pressed, the microcomputer 24 judges whether or not the system is in the muting state (step S61) as shown in FIG. 6. This judgement is performed by using the contents of a muting flag $F_M$. Since $F_M = 0$ when the system is not in the muting state, the microcomputer 24 generates the muting command (step S62), and sets a "1" to the muting flag $F_M$ (step S63). The muting command is held in the command register 21, and the sequence controller 18 turns the muting switch circuit 30 off. Conversely, since $F_M = 1$ in the muting state, the microcomputer 24 generates the muting cancel command (step S64), and resets the muting flag $F_M$ to "0" (step S65). The muting cancel command is in turn held in the command register 21 in place of the muting command, and the sequence controller 18 turns the muting switch circuit 30 on.

Therefore, if the muting key is operated in this state, the muting switch circuit 30 turns off, and the muting switch circuit 30 turns on when the muting key is operated once more. During the period when the muting switch circuit 30 is off, the sequence controller 18 continues the operation of generating instructions according to programs.

As specifically explained in the foregoing, in the audio signal data processing system according to the present invention, the audio signal data from the input device is written into and read-out from the data memory via the first data bus, the audio data signal is sequentially read-out from the data memory and written into a location of the delay memory indicated by the writing address via the second data bus, and at the same time the audio signal data is read-out from a location of the delay memory indicated by the reading address and written into the data memory via the second bus, and a predetermined coefficient data is multiplied to the audio signal data having been read-out from the delay memory and written into the data memory. Therefore, the transferring process of the delay audio signal for the sound field control via the second data bus and the transferring process of the audio signal data for the multiplication of the coefficient data via the first data bus are concurrently performed at the same time. Therefore, the sound field control is performed with a sufficient accuracy and also with a function such as the graphic equalizer, even through the speed of the digital processing is not raised by using high-cost devices.

Furthermore, as described in the foregoing, in the audio signal data processing system according to the present invention the data memory and the delay memory are initialized when the sequence data program is changed. Therefore, the signal data by the former program does not remain after the start of the processing by the new sequence control program, and a proper audio signal data by the new sequence control program is immediately generated.

In the audio signal data processing system according to a still further feature of the present invention, a muting condition is attained by inhibiting the output of the audio signal data based on the result of the operating process of the system, from the output means as described above. Therefore, the operating process is continued even during the muting condition. This assures that a proper audio signal data according to the sequence control program is immediately generated after canceling the muting condition, so that an acoustic output from the electro-acoustic transducer such as a speaker by such an audio signal data can reach the listener without causing any sense of discontinuity upon canceling the muting condition.

Furthermore, in the audio signal data processing system according to a further feature of the present invention, the data memory is made up of at least two memory devices whose writing and reading operations can be performed independently from the other writing and reading operations as described above. Therefore, for performing two independent functions such as the control of sound field and the function of a graphic equalizer are to be performed concurrently, each memory device can be used independently. On the other hand, if only one function is required, the memory areas of the memory devices can be used as a continuous single memory area. Therefore, the processing of other functions can be performed by the DSP in addition to the control of sound field, so that the field of applications of the DSP can be expanded.

In the audio signal data processing system according to a still further feature of the present invention, the clock pulses which control the operational timings in the DSP are also supplied to the A/D converter so that the sampling operation of the A/D converter is performed in synchronism with the clock pulses. Therefore it is unnecessary to provide a clock pulse generator separately. The structure of the system as a whole is thus simplified, and the reduction of cost is also attained.

Figure 11:
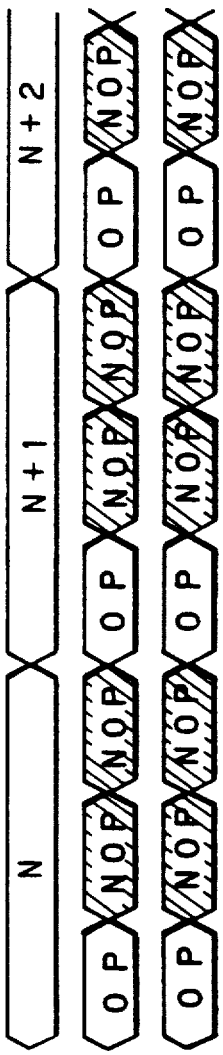
FIG. 11 is a diagram showing the time relationship between the count number of the program counter and processing instructions of the first and second programs in the case of the system according to the present invention.
Figure 9B:
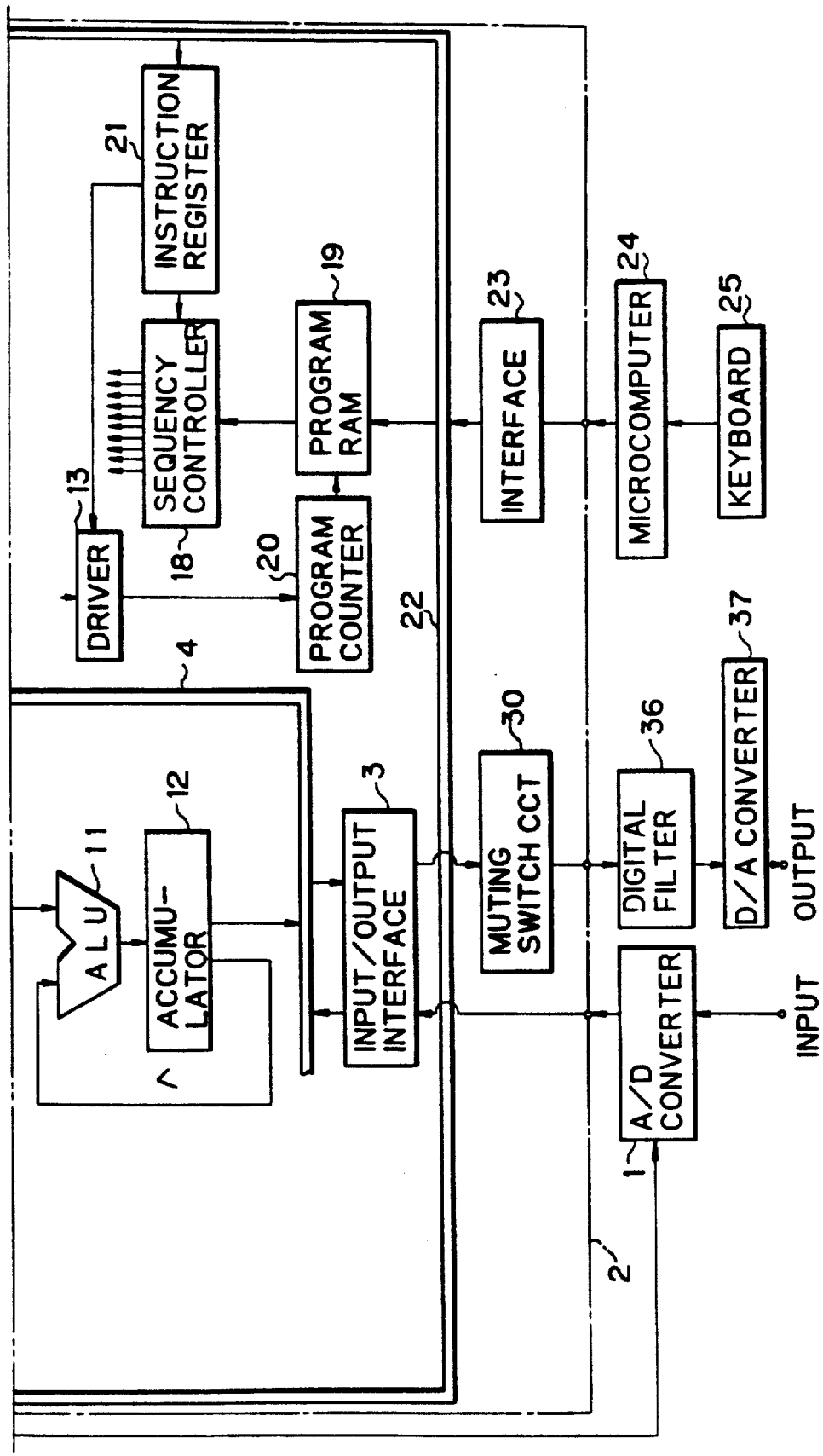
FIG. 9 is a block diagram showing another embodiment of the present invention.
Figure 10:
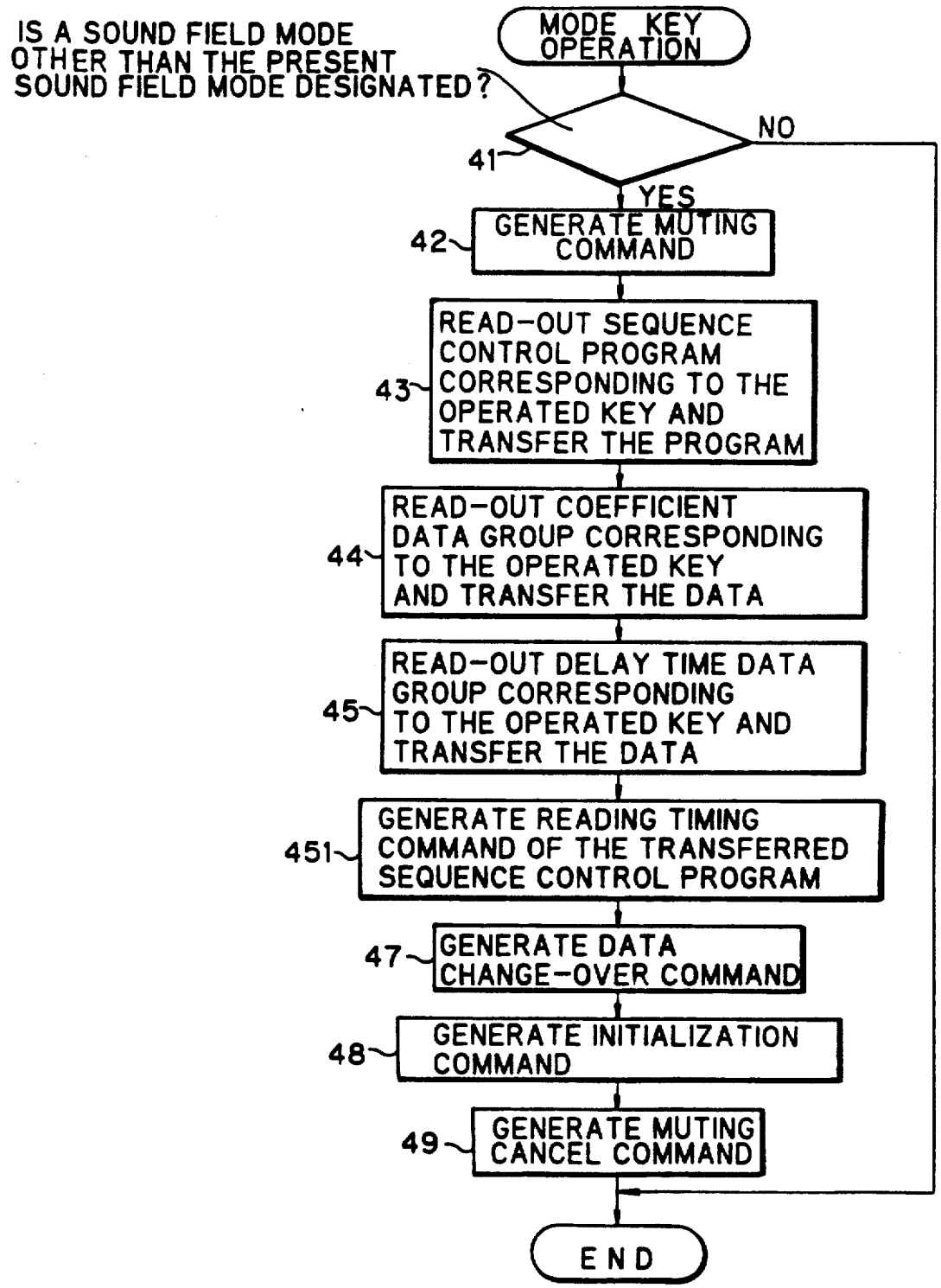
FIG. 10 is a flowchart showing the operation of the microcomputer in the system shown in FIG. 9.

Turning to FIGS. 9 through 11, another embodiment of the present invention will be explained. As shown in FIG. 9, the structure of the system in this embodiment is almost the same as the structure shown in FIG. 1, and the explanation of the corresponding parts will not be repeated. In the structure shown in FIG. 9, the clock pulses from the clock generator 28 are supplied to the program counter via a divider 13. The divider 13 is configured such that its dividing ratio is varied in response to the instruction held in the instruction register.

Figure 3:
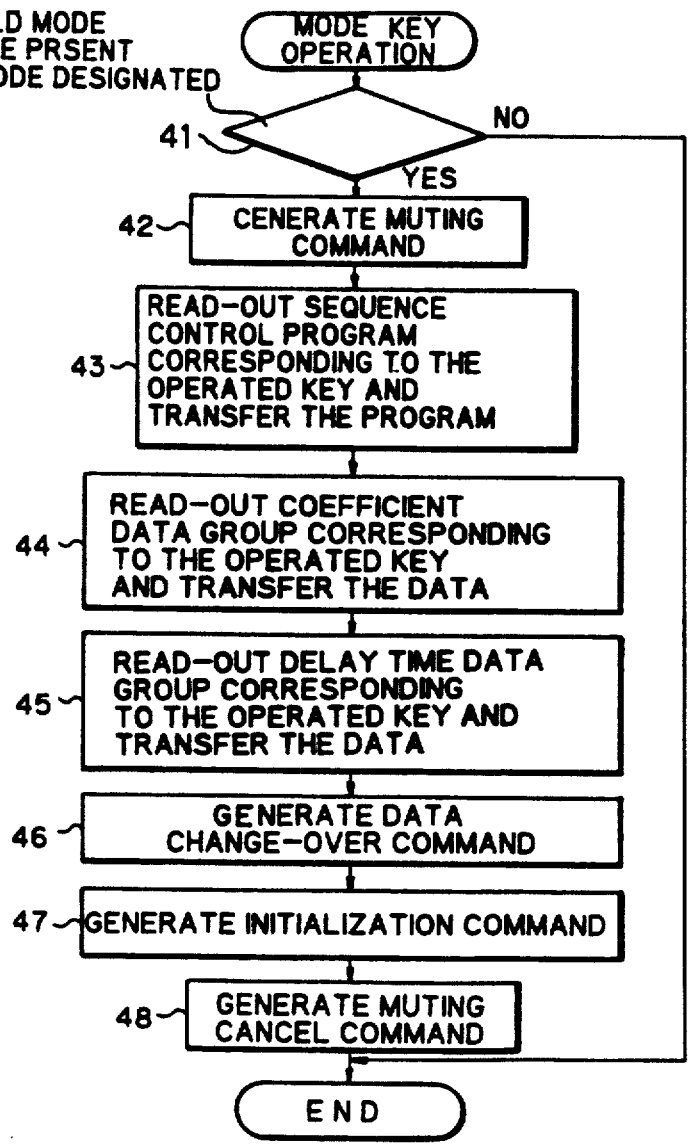
FIGS. 3, 5 and 6 are flowcharts showing the operation of a microcomputer in the system shown in FIG. 1.

The operation of the system shown in FIG. 9 will be explained with reference to the flowchart of FIG. 10. In this flow of operations shown in FIG. 10, the operations except the operation in step S451 are the same as those shown in FIG. 3, and the explanation thereof will not be repeated. After transferring the coefficient data and delay time data to the transfer buffers 26 and 27 in step S45, the microcomputer 24 reads from the ROM a reading timing command having a content designating the timing of reading of the sequence control program 19 having been transferred, and in turn transfers it (step S451). When the timing command is held in the predetermined location of the command register 21, the timing command is supplied to the divider 13 as a dividing ration varying signal, so that the divider performs a dividing operation according to the contents of the timing command. As a result, the clock pulses from the clock generator 28 are divided at the dividing ratio of the divider 13, and in turn supplied to the program counter 20. Therefore, the counting speed of the program counter 20 equals a speed corresponding to the sequence control program written in the RAM 19, and the count value of the program counter 20 is incremented by one at timings determined by this speed. Each time the count value is incremented, new processing instructions are fetched from the first and second programs of a parallel processing program stored in the RAM 19 and supplied to the sequence controller 18 by the program memory control circuit described above. Accordingly, instruction signals corresponding to the processing instructions are respectively generated, and processing operations are performed in the DSP 2.

Figure 7:
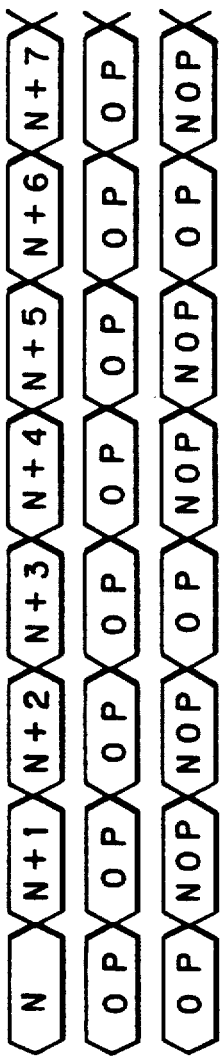
FIGS. 7 and 8 are diagrams showing the time relationship between the count number of a program counter and processing instructions of first and second programs.
Figure 8:
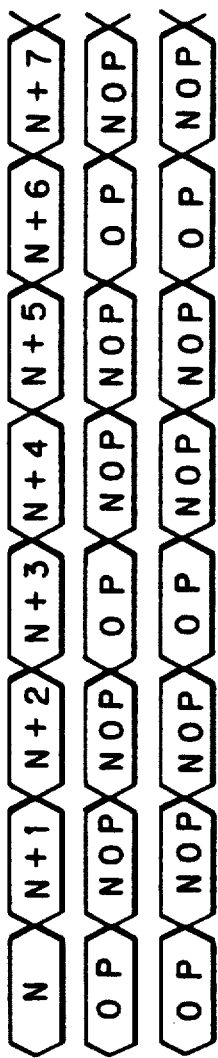

When the processing operation by the processing instruction OP in the first program is not subjected to the result of processing operation by the processing instruction OP in the second program, the interval of counting by the program counter 20 becomes equal to the execution time interval of one step, as depicted in FIG. 7. When, on the other hand, the processing operation by the processing instruction OP in the first program is subjected to the result of processing operation by the processing instruction OP in the second program, the interval of counting by the program counter 20 becomes equal to the execution time interval of three steps, as depicted in FIG. 11. More specifically, in this case the count value of the program counter 20 will not advance even if the processing operation is performed for more than the execution time interval of one step. Therefore, the relation between the speeds of the execution in the first and second programs becomes as in the case where the instruction NOP not included in the sequence control program is inserted by the sequence controller 18 in a manner as indicated by the portions covered by oblique lines in FIG. 11.

After the execution of the step 451, the microcomputer 24 issues the data change-over command to the sequence controller 18 in step 47 as in the embodiment described before.

As specifically described in the foregoing, in the above-described embodiment of the present invention, the time interval between fetching of each processing instruction at one step and fetching of each processing instruction at the next step is adjusted in response to an externally supplied command. By this provision, it becomes unnecessary to insert the processing instruction NOP into the programs even in cases where one of programs of a parallel processing program has a processing operation OP requiring an execution time interval longer than one step, and the processing operation by the processing instruction OP of the other program is subjected to the result of such a processing operation. Therefore, the efficiency of processing can be increased without increasing the capacity of the program memory. For instance, if the operation of transferring the signal delay data from the delay memory to the data memory takes more time than the arithmetic operation, such a transferring operation can be executed more times in a program than the number of times attained with conventional arrangements.

Figure 12:
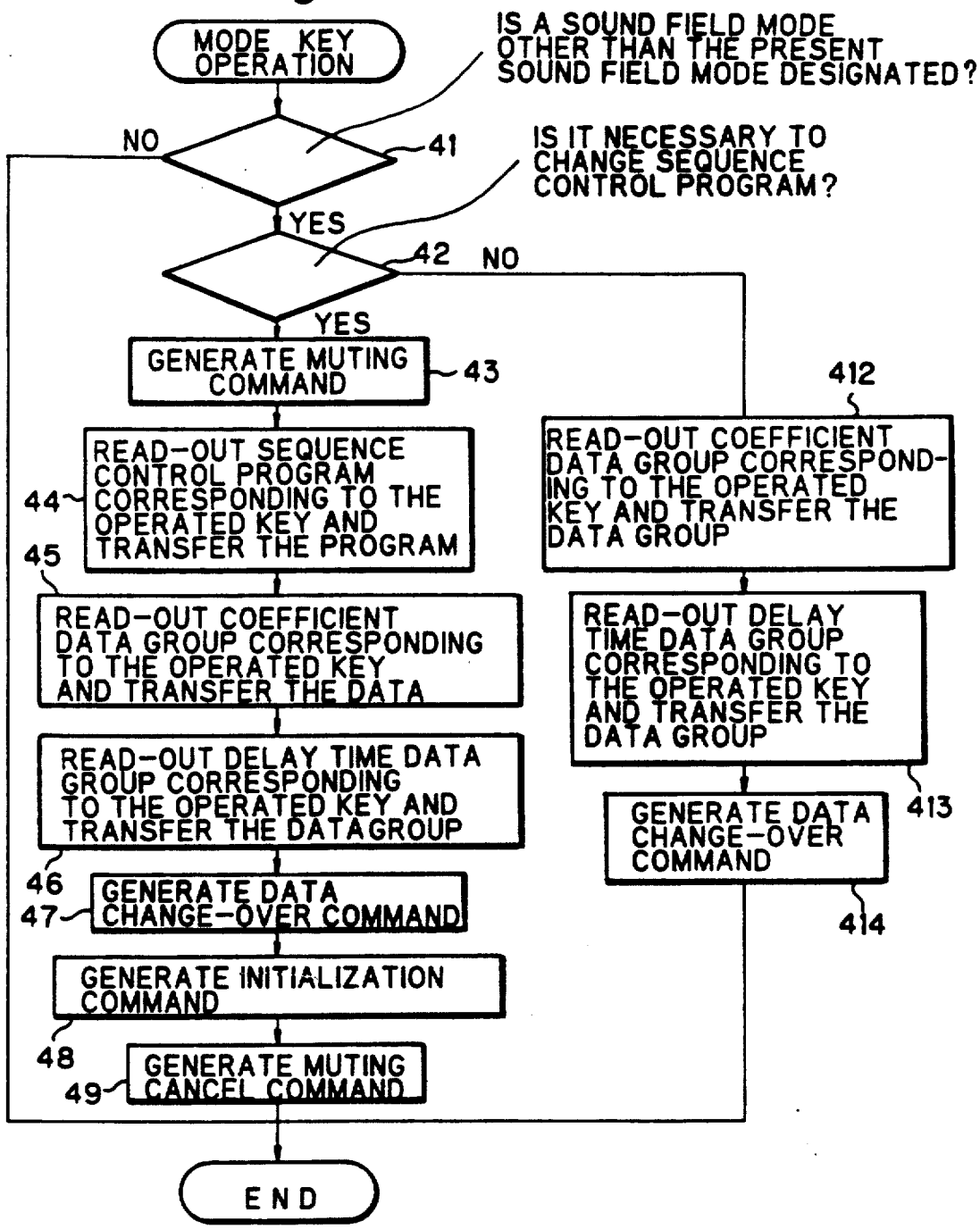
FIG. 12 is a flowchart showing the operation of the microcomputer in the system shown in FIG. 1 in a further embodiment of the present invention.

Turning to FIG. 12, a still further embodiment of the present invention will be explained. The structure of the system in this embodiment is the same as the structure shown in FIG. 1, and the explanation of the corresponding parts will not be repeated.

The operation of the system in this embodiment will be explained with reference to the flowchart of FIG. 12. In this flow of operations shown in FIG. 12, the operations in steps 41 through 48 are the same as those shown in FIG. 3, and the explanation thereof will not be repeated. When it is judged in step 41 that a sound field mode other than the presently selected sound field mode is designated, the processor judges whether or not a change of the sequence control program is necessary (step 411). If it is necessary to change the sequence control program, the microcomputer 42 immediately issues the muting command to the sequence controller 18, to turn off the muting switch circuit 30 so that the system is put in the muting condition (step 43), as in the embodiment described before. When, on the other hand, it is judged in step 411 that the change of the sequence control program is not necessary, the microcomputer 24 retrieves a coefficient data group corresponding to the operated key from the ROM, and transfers the coefficient data group to the transfer buffer 26 (step S412). Then, the microcomputer 24 retrieves a delay time data group corresponding to the operated key from the ROM, and transfers the delay time data group to the transfer buffer 27 (step 413) After transferring the coefficient data group and the delay time data group to the transfer buffers 26 and 27, the microcomputer 24 generates the data change-over command to the sequence controller 18 (step S414). Through these operations, when the change of the sequence control program is not necessary, the coefficient data group transferred to the transfer buffer 26 is written in predetermined locations of the RAM 10, and the delay time data group transferred to the transfer buffer 27 is written in predetermined locations in the RAM 17, without entering into steps placing the system in the muting condition.

In the above-described embodiment of the audio signal data processing system, for rewriting the data in the coefficient memory the new coefficient data is once held in the first transfer buffer and in turn transferred to the coefficient data memory. Similarly, for rewriting the data in the delay time data memory, the new delay time data is once held in the second transfer buffer and in turn transferred to the delay time data memory. With such a configuration, the rewriting of data in the coefficient data memory and the delay time data memory can be finished in a short time because the number of unit bits of the data for the transfer can be performed in the first and second transfer buffers even if the number of unit bits of the data to be transferred by the microcomputer is smaller than the number of unit bits of the data controlled in the DSP. Therefore, the muting function for interrupting the output of the DSP or the interruption of the processing operation of the DSP has become unnecessary, and the audio output signal is produced without interruption.

What is claimed is:

1. An audio signal data processing system comprising:
   first and second data buses;
   a data memory coupled to said first and second data buses;
   a delay memory coupled to said second data bus;
   input means coupled to said first data bus for sequentially supplying an audio signal data;
   data memory control means, coupled to said data memory, for writing said audio signal data into said data memory from said first data bus and reading-out the audio signal data from said data memory onto said first data bus and for reading-out said audio signal data from said data memory onto said second data bus for producing a delayed audio signal data and for writing said delayed audio signal data from said second data bus into said data memory;
   delay memory control means, coupled to said delay memory, for storing the audio signal data from said second bus into a location of said delay memory indicated by a writing address, and for reading-out said audio signal data from a location of said delay memory indicated by a reading address onto said second data bus, thereby producing said delayed audio signal data;

a coefficient data memory for storing a predetermined coefficient data;

arithmetic means, coupled to said first data bus and said coefficient data memory, for multiplying said predetermined coefficient data by said audio signal data having been read-out from the data memory for producing acoustic control; and output means, coupled to said first data bus, for providing the audio signal data in accordance with a result of operation of said arithmetic means, wherein said data memory control means writes and reads said audio signal data and said delayed audio signal data into and from said data memory respectively through a first data bus, and said second data bus, said first and second data buses being independent and distinct from each other.

2. An audio signal data processing system comprising:

first and second data buses independent and distinct from each other;

a data memory coupled to said first and second data buses;

a delay memory coupled to said second data bus;

input means coupled to said first data bus for sequentially supplying an audio signal data;

data memory control means, coupled to said data memory, for writing said audio signal data into said data memory from said first data bus and reading-out the audio signal data from said data memory onto said first data bus and for reading-out said audio signal data from said data memory onto said second data bus for producing a delayed audio signal data and for writing said delayed audio signal data from said second data bus into said data memory;

delay memory control means, coupled to said delay memory, for storing the audio signal data from said second bus into a location of said delay memory indicated by a writing address, and for reading-out said audio signal data from a location of said delay memory indicated by a reading address onto said second data bus, thereby producing said delayed audio signal data;

a coefficient data memory for storing a predetermined coefficient data;

arithmetic means, coupled to said first data bus and said coefficient data memory, for multiplying said predetermined coefficient data by said audio signal data having been read-out from the data memory for producing acoustic control; and output means, coupled to said first data bus, for providing the audio signal data in accordance with a result of operation of said arithmetic means;

sequence control means coupled to said input means, said data memory control means, said delay memory control means, said arithmetic means and said output means for controlling operations of said input means, said data memory control means, said delay memory control means, said arithmetic means and said output means in accordance with a designated program; and program setting means for supplying said designated program to said sequence control means and for initializing said data memory and said delay memory through said sequence control means whenever another program is designated.

3. An audio signal data processing system comprising:

first and second data buses independent and distinct from each other;

a data memory coupled to said first and second data buses;

a delay memory coupled to said second data bus;

input means coupled to said first data bus for sequentially supplying an audio signal data;

data memory control means, coupled to said data memory, for writing said audio signal data into said data memory from said first data bus and reading-out the audio signal data from said data memory onto said first data bus and for reading-out said audio signal data from said data memory onto said second data bus for producing a delayed audio signal data and for writing said delayed audio signal data from said second data bus into said data memory;

delay memory control means, coupled to said delay memory, for storing the audio signal data from said second bus into a location of said delay memory indicated by a writing address, and for reading-out said audio signal data from a location of said delay memory indicated by a reading address onto said second data bus, thereby producing said delayed audio signal data;

a coefficient data memory for storing a predetermined coefficient data;

arithmetic means, coupled to said first data bus and said coefficient data memory, for multiplying said predetermined coefficient data by said audio signal data having been read-out from the data memory for producing acoustic control; and output means, coupled to said first data bus, for providing the audio signal data in accordance with a result of operation of said arithmetic means, wherein the data memory comprises at least two memory devices in which writing and reading operations of each memory device can be performed independently, and wherein said at least two memory devices are used independently whenever a processing operation using said delay memory is performed, and memory areas of said at least two memory devices are used as a consecutive memory area whenever a processing operation not using said delay memory is performed.

4. An audio signal data processing system comprising:

first and second data buses independent and distinct from each other;

a data memory coupled to said first and second data buses;

a delay memory coupled to said second data bus;

input means coupled to said first data bus for sequentially supplying an audio signal data;

data memory control means, coupled to said data memory, for writing said audio signal data into said data memory from said first data bus and reading-out the audio signal data from said data memory onto said first data bus and for reading-out said audio signal data from said data memory onto said second data bus for producing a delayed audio signal data and for writing said delayed audio signal data from said second data bus into said data memory;

delay memory control means, coupled to said delay memory, for storing the audio signal data from said second bus into a location of said delay memory indicated by a writing address, and for reading-out said audio signal data from a location of said delay memory indicated by a reading address onto said second data bus, thereby producing said delayed audio signal data;

delay time memory control means, coupled to said delay memory control means for writing a delay time data into a delay time memory and reading said delay time data to designate said reading address;

coefficient memory control means for writing a coefficient data into a coefficient memory and for reading the coefficient data;

arithmetic means, coupled to said first data bus and said coefficient memory, for multiplying said coefficient data read from said coefficient memory by said audio signal data having been read-out from said data memory for providing acoustic control, wherein the coefficient memory control means has a first transfer buffer for holding said coefficient data and for rewriting the coefficient data in said coefficient memory by transferring the coefficient data held in said first transfer buffer, and said delay time memory control means has a second transfer buffer for holding said delay time data and for rewriting the delay time data in said delay time memory by transferring said delay time data held in said second transfer buffer.

* * * * *